United States Patent
Mehrabi et al.

(10) Patent No.: US 8,841,970 B2
(45) Date of Patent: Sep. 23, 2014

(54) LOW GM TRANSCONDUCTOR

(75) Inventors: Arash Mehrabi, San Diego, CA (US); Thurman S. Deyerle, IV, Midlothian, VA (US); Guoqing Miao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 6 days.

(21) Appl. No.: 13/427,785

(22) Filed: Mar. 22, 2012

(65) Prior Publication Data
US 2013/0249633 A1 Sep. 26, 2013

(51) Int. Cl.
*H03F 3/04* (2006.01)
*H03F 3/45* (2006.01)

(52) U.S. Cl.
USPC .......................................... 330/288; 330/257

(58) Field of Classification Search
USPC .................. 330/257, 288; 323/316
See application file for complete search history.

(56) References Cited

U.S. PATENT DOCUMENTS

| | | | |
|---|---|---|---|
| 4,689,607 A | 8/1987 | Robinson | |
| 5,241,227 A | 8/1993 | Jung et al. | |
| 6,727,757 B1 | 4/2004 | Venkatraman et al. | |
| 7,113,044 B2 * | 9/2006 | Wang | 330/288 |
| 7,142,056 B2 | 11/2006 | Blecker et al. | |
| 7,250,819 B2 | 7/2007 | Kelly et al. | |
| 7,656,230 B2 | 2/2010 | Fagg | |
| 2002/0089377 A1 | 7/2002 | Hwang | |
| 2006/0055465 A1 * | 3/2006 | Lin et al. | 330/288 |
| 2007/0057660 A1 * | 3/2007 | Lin | 323/316 |

OTHER PUBLICATIONS

International Search Report and Written Opinion—PCT/US2013/033482, International Search Authority—European Patent Office, Nov. 28, 2013.
Partial International Search Report—PCT/US2013/033482—ISA/EPO—Sep. 11, 2013.

* cited by examiner

*Primary Examiner* — Steven J Mottola
(74) *Attorney, Agent, or Firm* — Ramin Mobarhan (57) ABSTRACT

Techniques for designing a transconductor configurable to have a low transconductance. In one aspect, a voltage to current conversion module is coupled to a 1:N current replication module. The voltage to current conversion module may be implemented as an operational amplifier configured with negative feedback to generate a current through a transistor, wherein such current is proportional to the difference between an input voltage and a common-mode reference. The 1:N current replication module is configured to mirror the generated current in another transistor, to a predetermined ratio, such that the output current is also proportional to the difference between the input voltage and the common-mode reference. In exemplary embodiments, the output stage driving the output current may be configured to operate as a Class A, Class B, or Class AB type amplifier.

16 Claims, 9 Drawing Sheets

$$\left(\frac{W}{L}\right)_{M2} : \left(\frac{W}{L}\right)_{M1} = N$$

FIG 1

(PRIOR ART)

LOW GM TRANSCONDUCTOR

BACKGROUND

1. Field

The disclosure relates to circuit design, and in particular, to techniques for designing a transconductor configurable to have low transconductance (Gm).

2. Background

In the art of electronics, a transconductance element is designed to generate an output current proportional to an input voltage. In certain applications, a very low transconductance (or correspondingly, very high resistance) is desired, e.g., to maintain a DC bias voltage at a node while introducing minimal bandwidth degradation. Providing elements with very low transconductance in integrated circuits poses a challenge, as the required die area is generally proportional to the size of the resistance, which would be very large in this case.

It would be desirable to provide robust and area-efficient techniques for implementing transconductance elements in integrated circuits configurable to have very low transconductance.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
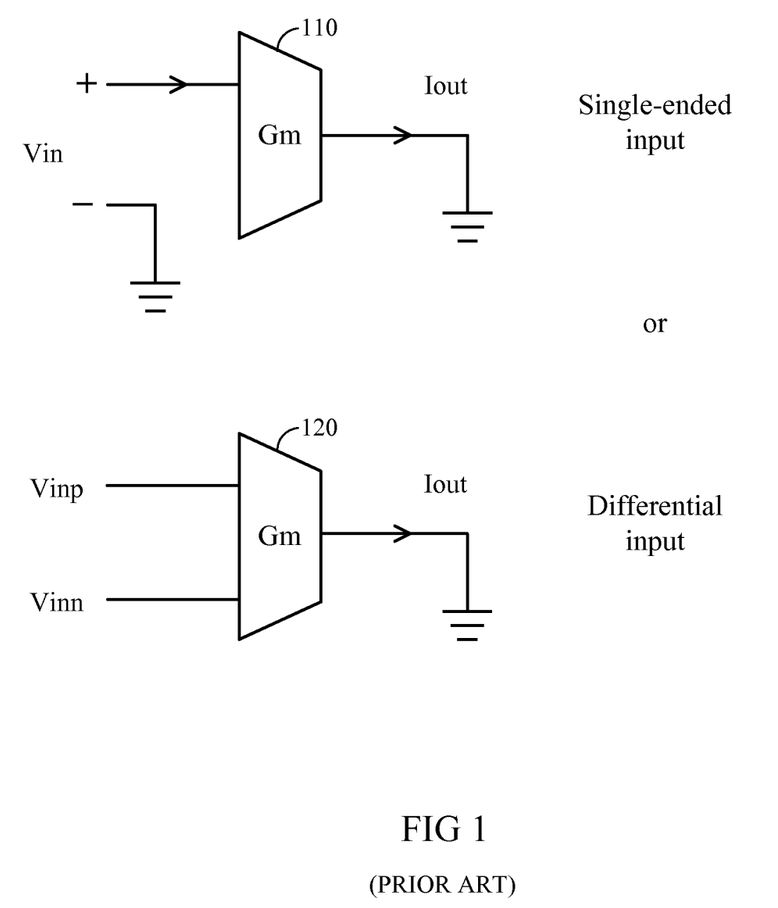
FIG. 1 illustrates prior art generic single-ended and differential transconductors that are used to describe the techniques of the present disclosure.

FIG. 1 illustrates prior art generic single-ended and differential transconductors that are used to describe the techniques of the present disclosure. In FIG. 1, a single-ended differential transconductor 110 accepts a single-ended input voltage Vin referenced to ground, and generates a current Iout according to the equation: Iout=Gm·Vin, wherein Gm represents the transconductance. A differential transconductor 120 accepts a differential input voltage (Vinp, Vinn), and generates a current Iout according to the equation Iout=Gm·(Vinp−Vinn).

It will be appreciated that in certain applications, the transconductors 110, 120 may be called on to provide a very low (e.g., "ultra-low," or on the order of pico-siemens) transconductance Gm. Implementing such low transconductance using conventional integrated circuit passive elements such as on-chip resistors may undesirably consume a great deal of die area, as the required die area is typically proportional to the required resistance. It would be desirable to provide robust and area-efficient techniques for designing transconductors having very low Gm in integrated circuits.

Figure 2:
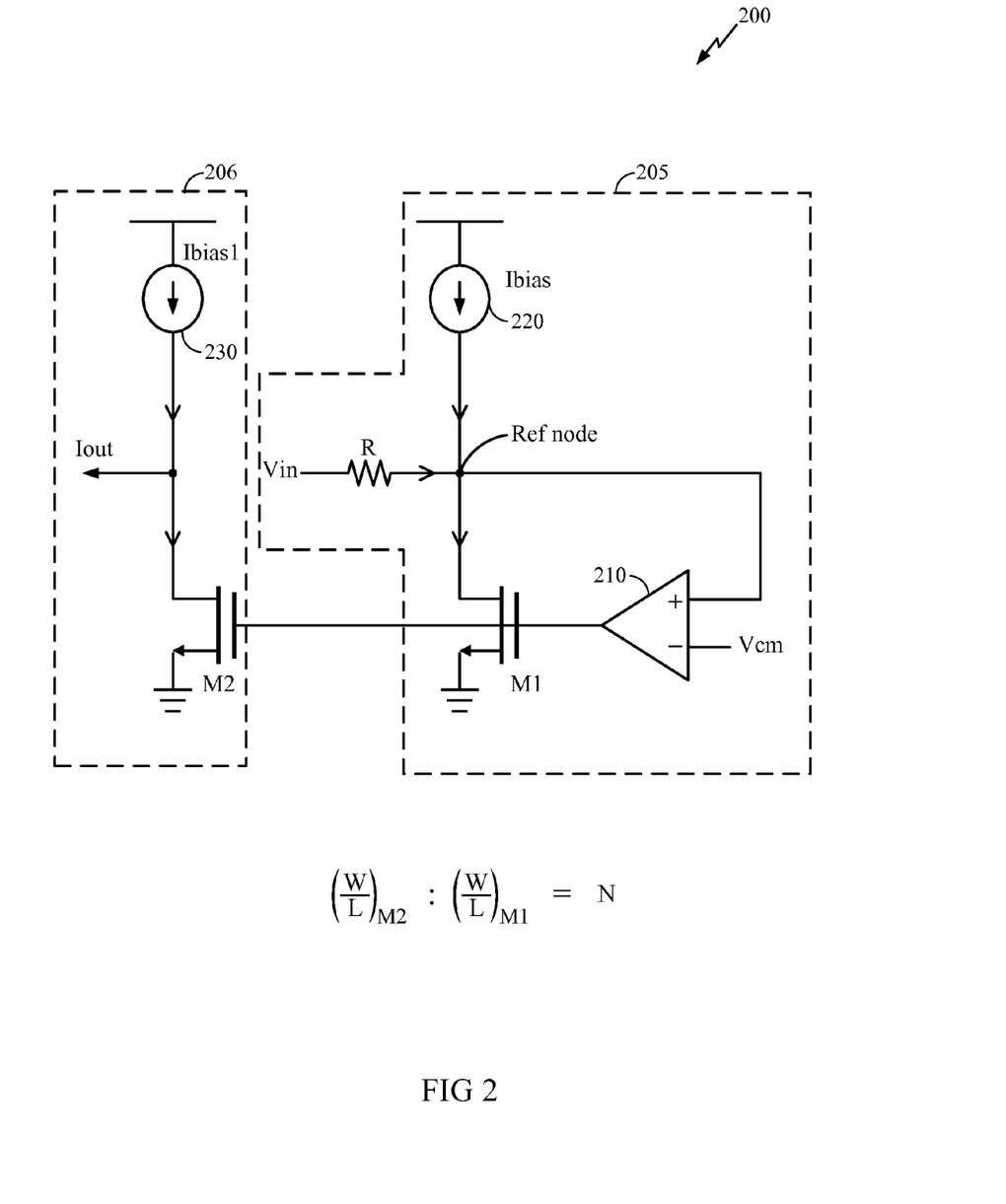
FIG. 2 illustrates an exemplary embodiment of a single-ended transconductor design according to the present disclosure.

FIG. 2 illustrates an exemplary embodiment 200 of a single-ended transconductor design according to the present disclosure. Note FIG. 2 is shown for illustrative purposes only, and is not meant to limit the scope of the present disclosure to only single-ended designs. The techniques illustrated in FIG. 2 for the single-ended case may be readily applied by one of ordinary skill in the art to design circuitry for processing a differential signal, and such alternative exemplary embodiments are contemplated to be within the scope of the present disclosure.

In FIG. 2, the singled-ended voltage Vin is coupled to a reference node (labeled "Ref node" in FIG. 2) by a resistor R. Ref node is simultaneously coupled to the drain of transistor M1 and to the positive input terminal of an operational amplifier 210. The negative terminal of amplifier 210 is coupled to a reference voltage, e.g., a common-mode reference voltage, labeled Vcm.

It will be appreciated that the amplifier 210 is configured with negative feedback to control the gate voltage of transistor M1 such that the voltage at Ref node is driven close to Vcm. This sets the current through R to be approximately (Vin−Vcm)/R, assuming that the voltage at Ref node is approximately Vcm. The current through M1 may then be expressed as Ibias+(Vin−Vcm)/R. It will thus be appreciated that the current through M1 is related to the input voltage Vin as (Vin−Vcm)/R, plus a constant offset term Ibias generated by the current source 220.

In FIG. 2, the gate voltage of M1 is further coupled to the gate of transistor M2, which is sized to a fixed proportion N relative to M1, i.e., the width-to-length ratio (W/L) of M2 may be N times that of M1, or $(W/L)_{M2}=N \cdot (W/L)_{M1}$. In an exemplary embodiment, N may be much less than 1, in which case the current through M2 will be much less than the current through M1, and the circuit 200 may act as a low (or very low) Gm transconductor, as further described hereinbelow.

It will be appreciated that the transistor M2 effectively "mirrors" or "replicates" the current through M1 to a fixed ratio, N. In this specification and in the claims, it will be appreciated that the terms "mirror" and "replicate" are not meant to imply that two mirrored or replicated currents are of the same value, but rather that two mirrored or replicated currents are at a fixed predetermined ratio relative to one another.

While exemplary embodiments are described wherein a transconductor may be designed to have a very low Gm, it will be appreciated that the same principles may be applied to design a transconductor having any Gm, i.e., not just low Gm. For example, in an alternative exemplary embodiment, N may instead be greater than 1, in which case the current through M2 will be greater than the current through M1, and the circuit 200 may function as a transconductor having a transconductance that is not necessarily low. Such alternative exemplary embodiments are contemplated to be within the scope of the present disclosure.

In light of the above description, it will be appreciated that the current through M2 may be expressed as N·[Ibias+(Vin−Vcm)/R]. Iout may then be expressed as Ibias1−N·[Ibias+(Vin−Vcm)/R]. If Ibias1 is chosen to be N·Ibias, as may be done by, e.g., proportionally sizing transistors implementing the current sources Ibias 220 and Ibias1 230, then the expression for Iout may be simplified to (−1)·N·(Vin−Vcm)/R.

For the single-ended implementation shown in FIG. 2, Iout is then related to Vin as Iout=(−1)·N·(Vin−Vcm)/R. If, omitting the common-mode component, Iout is further simplified to N·Vin/R, then the transconductance Gm of the circuit 200 is seen to be equal to (N/R). In an exemplary embodiment, by appropriately choosing N to be much less than 1, it will be seen that Gm may be reduced to a suitably low value.

It will be appreciated that in certain exemplary embodiments, the size ratio N may be made adjustable using, e.g., a plurality of independently switchable constituent transistors to implement the single transistor M2 shown in FIG. 2, and thus Gm may be further dynamically controlled. Alternatively or in conjunction, Gm may also be controlled by varying R, e.g., by implementing R as a switchable bank of parallel resistors, etc. Such alternative exemplary embodiments are contemplated to be within the scope of the present disclosure.

It will be appreciated that using a resistor R as shown in FIG. 2 allows for rail-to-rail, or potentially even larger, voltage input swing at Vin. In particular, even if Vin exceeds a supply voltage VDD, the current through M1 would be correspondingly increased, and there would be no expected voltage clipping at the input. Thus, no undesirable non-linearities would be introduced into Iout. It will be appreciated that common-mode feedback may further be applied by controlling the bias currents, e.g., either Ibias or Ibias1.

Figure 3:
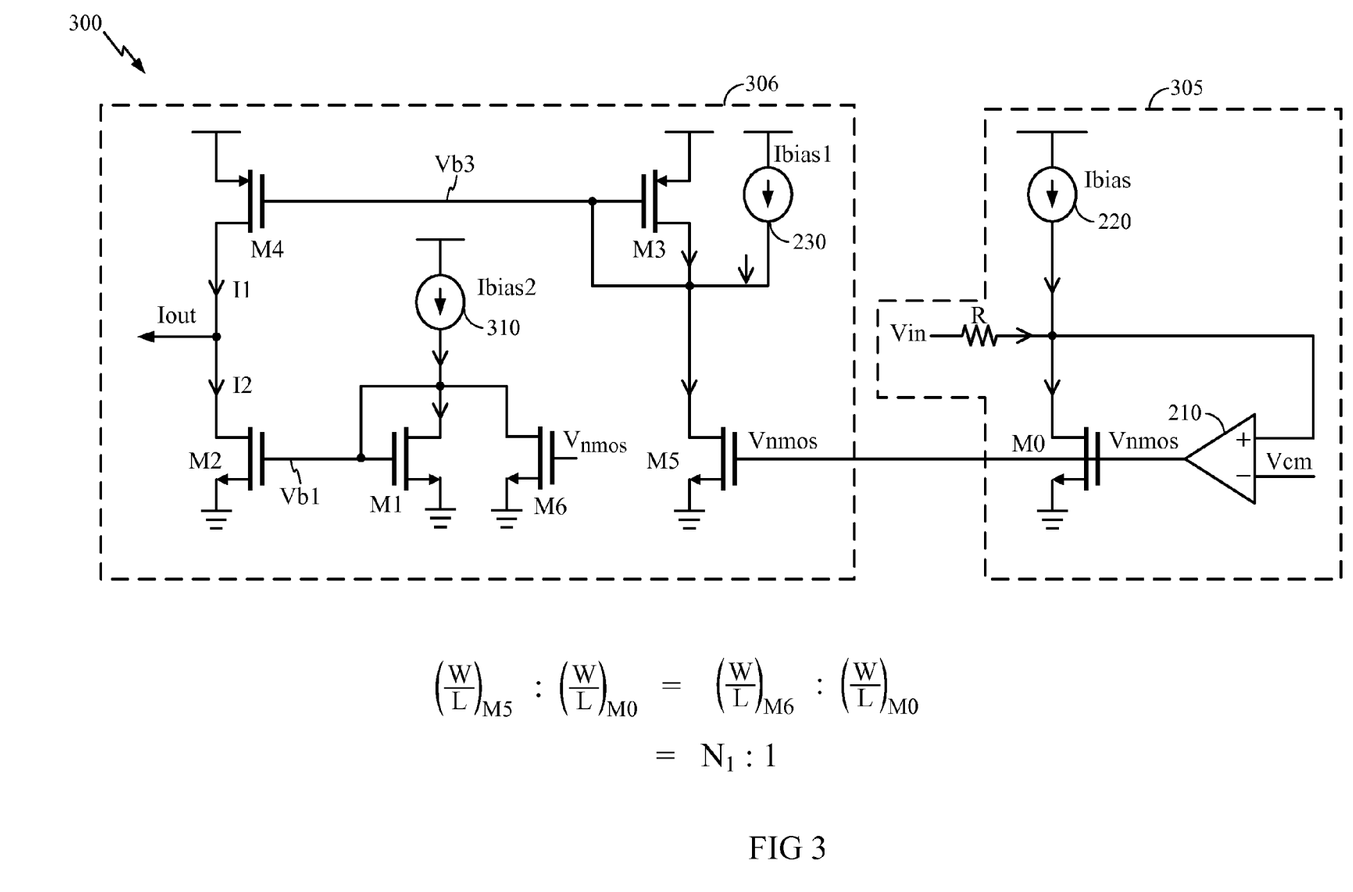
FIG. 3 illustrates an alternative exemplary embodiment of a single-ended transconductor according to the present disclosure.

FIG. 3 illustrates an alternative exemplary embodiment 300 of a single-ended transconductor according to the present disclosure. Note the techniques illustrated in FIG. 3 for the single-ended case may be readily applied to design circuitry for processing a differential signal by one of ordinary skill in the art, and such alternative exemplary embodiments are contemplated to be within the scope of the present disclosure.

In FIG. 3, the portion of the circuitry labeled 305 performs functionality similar to the portion of circuitry labeled 205 in FIG. 2. In particular, a bias voltage Vnmos for the transistor M0 is generated according to the principles described hereinabove with reference to FIG. 2. In FIG. 3, Vnmos is further coupled to transistor M5, which is sized relative to M0 as $(W/L)_{M5}=N_1 \cdot (W/L)_{M0}$. The current through M5 may thus be expressed as $N_1 \cdot$[Ibias+(Vin−Vcm)/R]. If Ibias1 in FIG. 3 is chosen as Ibias1=$N_1 \cdot$Ibias, then the current through transistor M3 may be expressed as $(-1) \cdot N_1 \cdot$(Vin−Vcm)/R. From FIG. 3, it is noted that the current through M3 is further mirrored through M4 as I1 by coupling the gate voltage Vb3 of M3 to M4. In an exemplary embodiment, the size of M4 may be chosen at a fixed predetermined ratio relative to the size of M3, such that $(W/L)_{M4}=N_2 \cdot (W/L)_{M3}$, and the overall ratio between the currents of M4 and M0 may be expressed as $N=N_1 \cdot N_2$.

Similarly, Vnmos is further coupled to transistor M6, which is also sized relative to M0 as $(W/L)_{M6}=N_1 \cdot (W/L)_{M0}$. The current through M6 may thus also be expressed as $N_1 \cdot$[Ibias+(Vin−Vcm)/R]. If Ibias2 is also chosen as Ibias=$N_1 \cdot$Ibias, then the current through transistor M1 may be expressed as $(-1) \cdot N_1 \cdot$(Vin−Vcm)/R. The current through M1 is further mirrored through M2 as I2 by coupling the gate voltage Vb1 of M1 to M2. In an exemplary embodiment, the size of M2 may be chosen at a fixed predetermined ratio relative to the size of M1, such that $(W/L)_{M2}=N_2 \cdot (W/L)_{M1}$, and the overall ratio $N=N_1 \cdot N_2$.

Note Iout may be expressed as I2−I1. From the above description, it will be understood that the transistors M4 and M2 effectively source and sink current, respectively, to a load (not shown) coupled to Iout. It will be appreciated that in the embodiment of FIG. 3, DC bias current is advantageously removed from the current copying devices M1 and M3, and thus also from the output devices M4 and M2. The regime of operation of M4 and M2 is thus similar to that of a Class B type amplifier, in which no quiescent current is present in either transistor (while the embodiment of FIG. 2 may correspondingly be understood to operate as a Class A type amplifier). Note as there is no bias current in M4 and M2, there is also no output noise in Iout when there is no input signal (Vin), and thus the circuit 300 affords the advantage of low noise. It will further be appreciated that in cases wherein the circuitry 300 is configured to have very low Gm values, the linearity disadvantages from using a Class B-type scheme may not be as significant due to the amplitude reduction of added harmonics in the loop.

Figure 4:
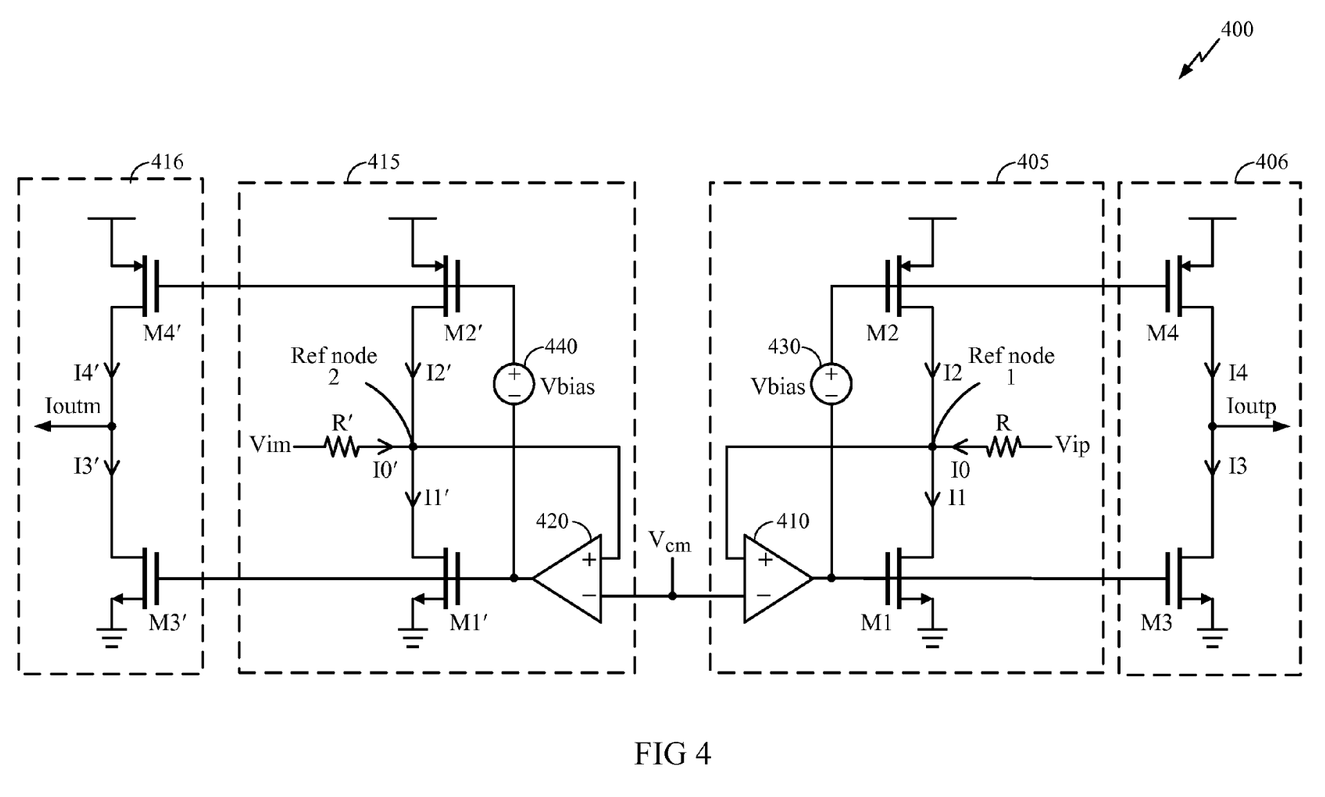
FIG. 4 illustrates an alternative exemplary embodiment of a differential transconductor according to the present disclosure.

FIG. 4 illustrates an alternative exemplary embodiment 400 of a differential transconductor according to the present disclosure. Note a portion 405 of the differential circuit corresponding to the positive current output Ioutp will be described, and it will be appreciated that similar principles apply to the operation of the other portion 415 of the differential circuit corresponding to the negative current output Ioutn. Note the differential transconductor of FIG. 4 is shown for illustrative purposes only, and is not meant to limit the scope of the techniques described with reference to FIG. 4 to differential implemenations only. One of ordinary skill in the art may readily derive single-ended implementations using the techniques shown in FIG. 4, and such alternative exemplary embodiments are contemplated to be within the scope of the present disclosure.

In FIG. 4, the positive voltage input Vip is coupled through resistor R to the node Ref node 1, which is further coupled to op amp 410, and transistors M1 and M2. I0, or the current through the resistor R, may further be expressed in terms of the currents I1 and I2, corresponding to the currents through M1 and M2, respectively, as I0=I1−I2. Per negative feedback of the op amp 410, the voltage at Ref node 1 is driven to be approximately Vcm, and the current corresponds to (Vip−Vcm)/R. In particular, the op amp 410 drives the gate voltage of M1 and the gate voltage of M2 (through the voltage level-shifter Vbias) to generate currents I1 and I2, such that I1−I2= (Vip−Vcm)/R.

The gate voltages of M1 and M2 are coupled to the gates of M3 and M4, respectively, and M3 and M4 are coupled in push-pull configuration to generate the output current Ioutp. Note M3 in FIG. 4 may be sized relative to M1 as $(W/L)_{M3}=N \cdot (W/L)_{M1}$, and M4 may be sized relative to M2 as $(W/L)_{M4}=N \cdot (W/L)_{M2}$. Accordingly, the output current Ioutp may be expressed as I4−I3=N·(Vip−Vcm)/R. Corresponding analysis for the portion 415 of the differential circuit 400 yields I4'−I3'=N·(Vim−Vcm)/R. Thus overall, the circuit 400 provides a transconductance of (N/R) to the differential input voltage Vi=Vip−Vim (i.e., Vi·N/R=Ioutp−Ioutm=Iout). In an exemplary embodiment, N may be chosen to be much less than 1, so that the circuit 400 has very low transconductance, according to the techniques of the present disclosure.

In an exemplary embodiment, the voltage Vbias applied by the level-shifter 430 may be chosen as a DC offset voltage, such that a region of operation exists wherein both M2 and M1, and correspondingly, M4 and M3, are simultaneously conducting. In this manner, the output stage including M3, M4 may be understood to perform the functionality of a Class AB-type amplifier. One of ordinary skill in the art will appreciate that a Class AB amplifier has improved linearity over a Class B amplifier, while consuming less bias current than a Class A amplifier.

Figure 5:
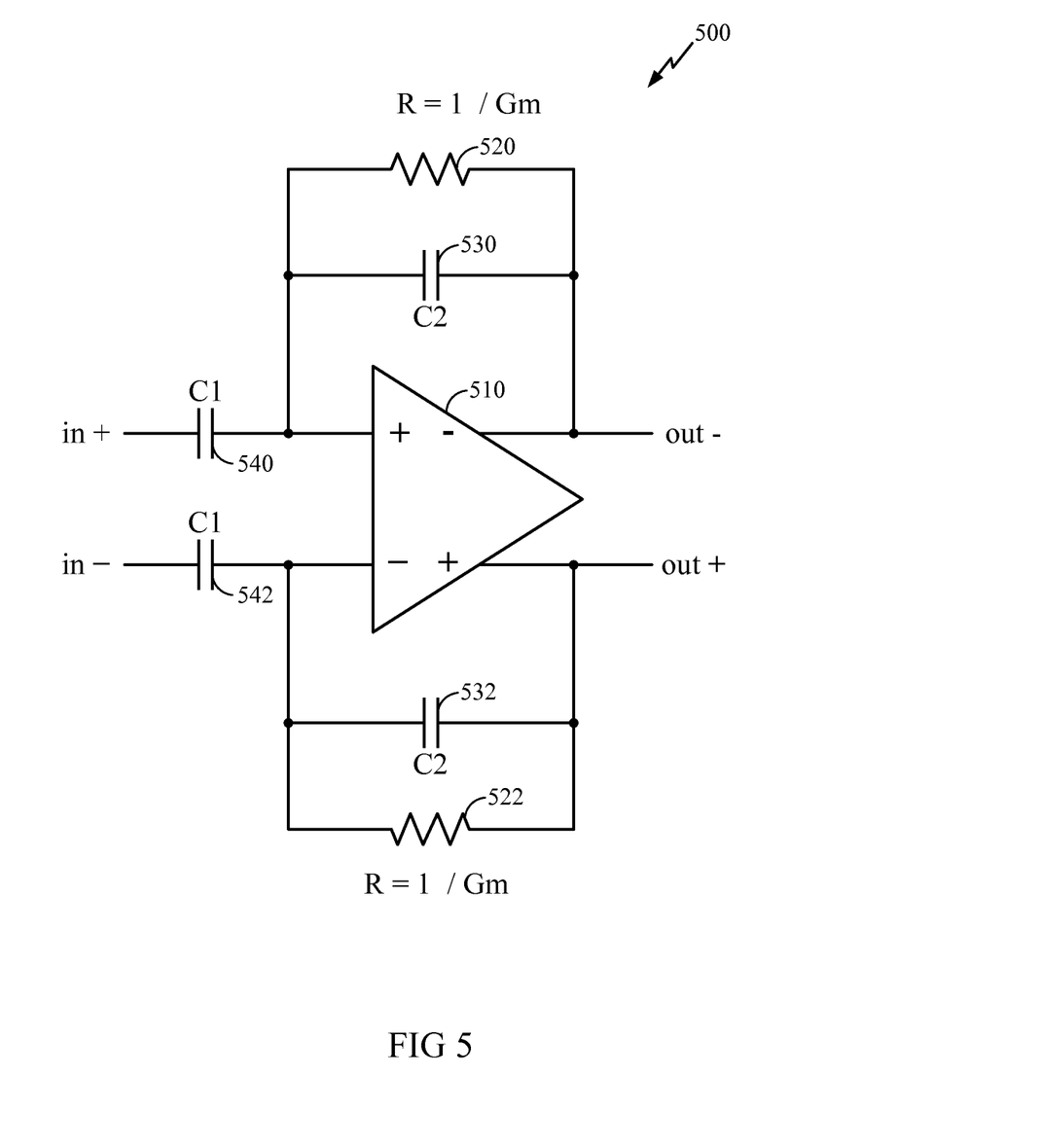
FIG. 5 illustrates an exemplary embodiment of an amplifier incorporating a transconductance circuit (Gm) that may utilize the design principles of the present disclosure.

FIG. 5 illustrates an exemplary embodiment of an amplifier 500 incorporating a circuit element 520 having transconductance Gm that may utilize the design principles of the present disclosure. Note the circuitry 500 is shown for illustrative purposes only, and is not meant to limit the scope of the present disclosure to any particular application of a transconductor designed according to the principles disclosed herein.

In FIG. 5, the amplifier 500 includes an op amp 510 having positive and negative input terminals, and positive and negative output terminals. The positive terminal is coupled via capacitor C1 540 to a positive input voltage in+, and the negative terminal is coupled via capacitor C1 542 to a negative input voltage in−. Capacitor C2 530 and Gm 520 further couple the negative output terminal to the positive input terminal, while capacitor C2 532 and Gm 522 couple the positive output terminal to the negative input terminal via negative feedback.

In an exemplary embodiment, the transconductance Gm of elements 520 and 522 may be set to an extremely low value, such that the DC bias of the op amp input terminals are provided by the op amp output terminals. Furthermore, the high-pass time constants C2/Gm of the feedback paths may be set appropriately for audio amplifier applications designed to process signals having audio bandwidths. It will be appreciated that the elements 520, 522 may be designed as transconductors using principles described hereinabove with reference to FIGS. 2, 3, and 4.

Figure 6A:
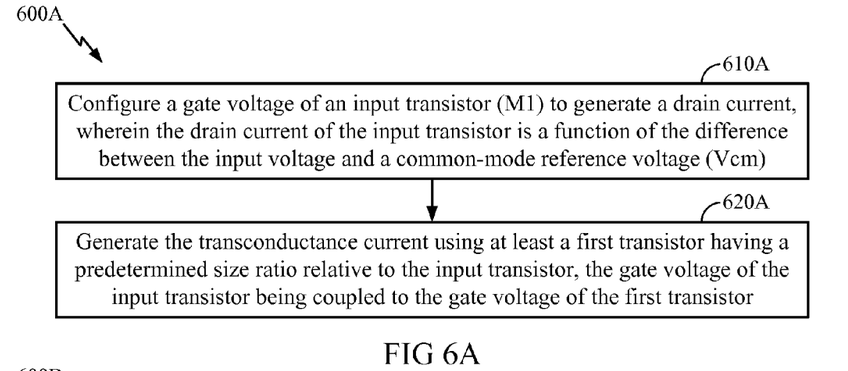
FIGS. 6A, 6B, and 6C illustrate exemplary embodiments of methods according to the present disclosure.
Figure 6B:
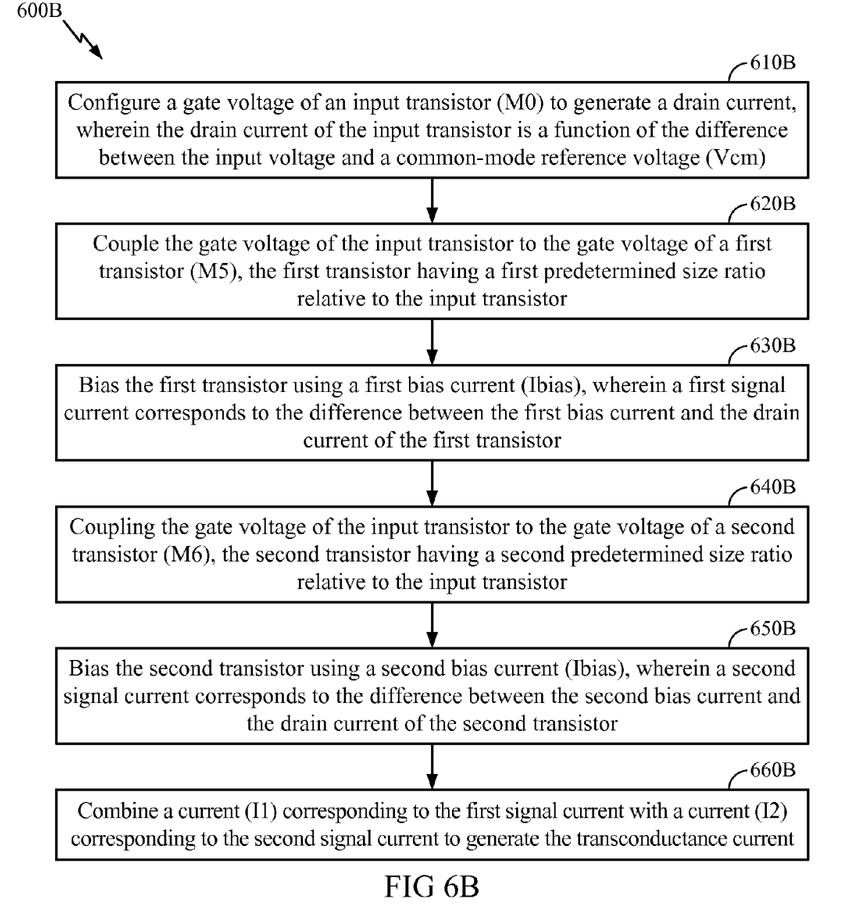
Figure 6C:
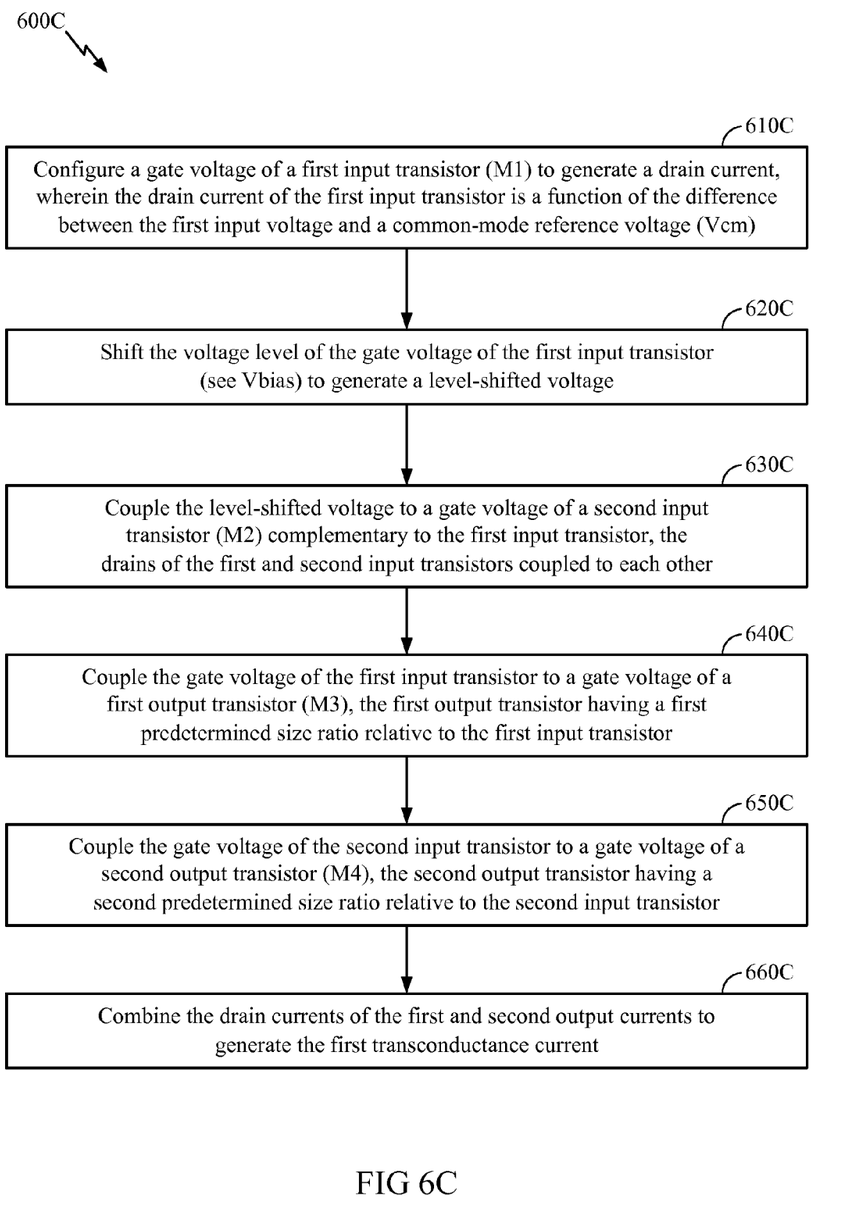

FIGS. 6A, 6B, and 6C illustrate exemplary embodiments of methods according to the present disclosure. Note the methods are shown for illustrative purposes only, and are not meant to limit the scope of the present disclosure to any particular method shown. Note indications of circuit elements in parentheses with reference to FIG. 6A may refer to corresponding elements labeled in FIG. 2, elements indicated in FIG. 6B may refer to corresponding elements labeled in FIG. 3, and elements indicated in FIG. 6C may refer to corresponding elements labeled in FIG. 4.

In FIG. 6A showing method 600A, at block 610A, a gate voltage of an input transistor (M1) is configured to generate a drain current. The drain current of the input transistor is a function of the difference between the input voltage and a common-mode reference voltage (Vcm).

At block 620A, the transconductance current is generated using at least a first transistor (M2) having a predetermined size ratio relative to the input transistor. The gate voltage of the input transistor is coupled to the gate voltage of the first transistor.

In FIG. 6B showing method 600B, at block 610B, a gate voltage of an input transistor (M0) is configured to generate a drain current. The drain current of the input transistor is a function of the difference between the input voltage and a common-mode reference voltage (Vcm).

At block 620B, the gate voltage of the input transistor is coupled to the gate voltage of a first transistor (M5). The first transistor has a first predetermined size ratio relative to the input transistor.

At block 630B, the first transistor is biased using a first bias current (Ibias). A first signal current corresponds to the difference between the first bias current and the drain current of the first transistor.

At block 640B, the gate voltage of the input transistor is coupled to the gate voltage of a second transistor (M6). The second transistor has a second predetermined size ratio relative to the input transistor.

At block 650B, the second transistor is biased using a second bias current (Ibias). A second signal current corresponds to the difference between the second bias current and the drain current of the second transistor.

At block 660B, a current (I1) corresponding to the first signal current is combined with a current (I2) corresponding to the second signal current to generate the transconductance current.

In FIG. 6C showing method 600C, at block 610C, a gate voltage of a first input transistor (M1) is configured to generate a drain current. The drain current of the first input transistor is a function of the difference between the first input voltage and a common-mode reference voltage (Vcm). Note indications of circuit elements in parentheses with reference to FIG. 6C may refer to corresponding elements labeled in FIG. 4.

At block 620C, the voltage level of the gate voltage of the first input transistor (see Vbias) is shifted to generate a level-shifted voltage.

At block 630C, the level-shifted voltage is coupled to a gate voltage of a second input transistor (M2) complementary to the first input transistor. The drains of the first and second input transistors coupled to each other.

At block 640C, the gate voltage of the first input transistor is coupled to a gate voltage of a first output transistor (M3). The first output transistor has a first predetermined size ratio relative to the first input transistor.

At block 650C, the gate voltage of the second input transistor is coupled to a gate voltage of a second output transistor (M4). The second output transistor has a second predetermined size ratio relative to the second input transistor.

At block 660C, the drain currents of the first and second output currents are combined to generate the first transconductance current.

Figure 7:
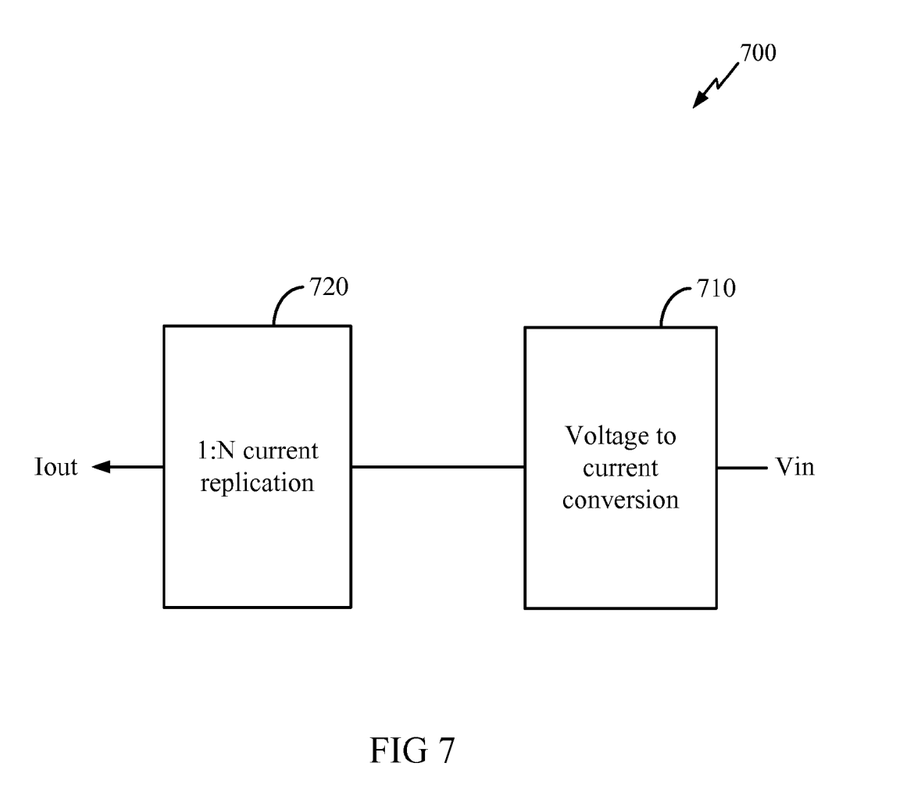
FIG. 7 illustrates an exemplary embodiment of a generalized transconductance element according to the present disclosure.

FIG. 7 illustrates an exemplary embodiment 700 of a generalized transconductance element according to the present disclosure. In FIG. 7, an input voltage Vin is provided to a voltage to current conversion module 710. The module 710 is coupled to a 1:N current replication module 720, which generates an output current Iout that is a 1:N replica of the output of module 710.

It will be appreciated that in exemplary embodiments, the voltage to current conversion module 710 may be implemented as, e.g., the block 205 of FIG. 2, the block 305 of FIG. 3, or the blocks 405, 415 of FIG. 4. In exemplary embodiments, the 1:N current replication module 720 may be implemented as, e.g., the block 206 of FIG. 2, the block 306 of FIG. 3, or the blocks 406, 416 of FIG. 4.

Figure 8:
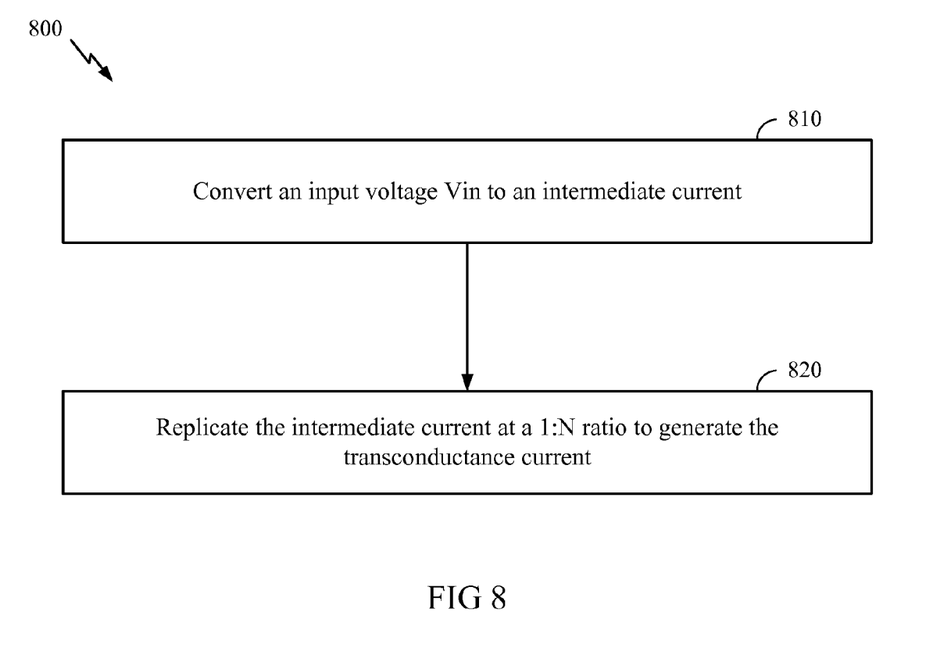
FIG. 8 illustrates an exemplary embodiment of a generalized method according to the present disclosure.

FIG. 8 illustrates an exemplary embodiment 800 of a generalized method according to the present disclosure. In FIG. 8, at block 810, an input voltage Vin is converted to an intermediate current. At block 820, the intermediate current is replicated at a 1:N ratio to generate the transconductance current (Iout).

In exemplary embodiments, the block 810 may be implemented as the block 610A of FIG. 6A, the block 610B of FIG. 6B, or the blocks 610C-620C of FIG. 6C. In exemplary embodiments, the block 820 may be implemented as, e.g., the block 620A of FIG. 6A, the blocks 620B through 660B of FIG. 6B, or the blocks 630C through 660C of FIG. 6C.

One of ordinary skill in the art will appreciate that while exemplary embodiments of the present disclosure have been described with reference to MOS transistors (e.g., MOSFET's), the techniques of the present disclosure need not be limited to MOSFET-based designs, but may be readily applied to alternative exemplary embodiments (not shown) employing bipolar junction transistors (or BJT's) and/or other three-terminal transconductance devices. In this specification and in the claims, the term "transistor" may generally encompass MOSFET's, BJT's, or any other types of three-terminal transconductance devices known in the art. For example, in an exemplary embodiment (not shown), any of the transistors described may utilize BJT's rather than MOSFET's, with the collectors, bases, and emitters of the BJT's coupled as shown for the drains, gates, and sources, respectively, of the MOSFET's shown. Furthermore, unless otherwise noted, in this specification and in the claims, the terms "drain," "gate," and "source" may encompass both the conventional meanings of those terms associated with MOSFET's, as well as the corresponding nodes of other three-terminal transconductance devices, such as BJT's, which correspondence will be evident to one of ordinary skill in the art of circuit design.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
an operational amplifier configured to set a gate voltage of an input transistor to generate a current, the current comprising a component proportional to an input voltage minus a reference voltage;
a resistor coupling the input voltage to an input of the operational amplifier, the resistance of the resistor defining the proportionality between the component current and the input voltage minus the reference voltage; and
a current replication module configured to replicate the current at a 1:N ratio to generate a transconductance current proportional to the input voltage, the current replication module comprising:
a first transistor having a predetermined size ratio relative to the input transistor, the gate voltage of the input transistor being coupled to the gate voltage of the first transistor;
the transconductance current being derived from the drain current of the first transistor; and
the current of the input transistor further comprising an input bias current, the first transistor being biased by a first bias current, the first bias current having the same predetermined size ratio relative to the input bias current as the first transistor has relative to the input transistor.

2. An apparatus comprising:
a voltage to current conversion module configured to convert an input voltage to a current, the voltage to current conversion module comprising:
an operational amplifier configured to set a gate voltage of an input transistor to generate the current, the current comprising a component proportional to the input voltage minus a reference voltage; and
a resistor coupling the input voltage to an input of the operational amplifier, the resistance of the resistor defining the proportionality between the component current and the input voltage minus the reference voltage;
the apparatus further comprising:
a current replication module configured to replicate the converted current at a 1:N ratio to generate a transconductance current proportional to the input voltage, the current replication module comprising:
a first transistor having a predetermined size ratio relative to the input transistor, the gate voltage of the input transistor being coupled to the gate voltage of the first transistor; the transconductance current being derived from the drain current of the first transistor; wherein the reference voltage is a ground voltage.

3. The apparatus of claim 1, wherein the reference voltage is a common-mode voltage, the apparatus further comprising:
a complementary operational amplifier configured to set a gate voltage of a complementary input transistor to generate a current, the current comprising a component proportional to a complementary input voltage minus the common-mode voltage; and
a complementary first transistor having a predetermined size ratio relative to the complementary input transistor, the gate voltage of the complementary input transistor being coupled to the gate voltage of the first complementary transistor.

4. The apparatus of claim 1, the drain of the input transistor coupled to the input voltage via the resistor at a reference node, the reference node further coupled to a positive differential input of the operational amplifier.

5. The apparatus of claim 1,
the current replication module further comprising:
a second transistor coupled to the drain of the first transistor in parallel with a current source generating the first bias current; and
a first output transistor having a gate voltage coupled to the gate voltage of the second transistor, the transconductance current being derived from the drain current of the first output transistor.

6. The apparatus of claim 5, the current replication module further comprising:
a third transistor having a gate voltage coupled to the gate voltage of the first transistor, the third transistor being biased by a third bias current;
a fourth transistor coupled to the drain of the third transistor in parallel with a current source generating the third bias current; and
a second output transistor having a gate voltage coupled to the gate voltage of the fourth transistor, wherein the transconductance current is further derived from the drain current of the second output transistor.

7. The apparatus of claim 1, the gate voltage of the first input transistor further coupled to the gate of a second input transistor via a voltage level-shifter;
the current replication module further comprising:
a second transistor having a predetermined size ratio relative to the second input transistor, the gate of the second input transistor being coupled to the gate of the second transistor;
wherein the drains of the first and second transistors are coupled to each other, and the transconductance current is derived from the drains of the first and second transistors.

8. The apparatus of claim 7, further comprising:
a complementary operational amplifier configured to set a gate voltage of a first complementary input transistor to generate a current, the current comprising a component proportional to a complementary input voltage minus the reference voltage, the gate voltage of the first complementary input transistor further coupled to the gate of a second complementary input transistor via a voltage level-shifter; the current replication module further comprising:
a first complementary transistor having a predetermined size ratio relative to the first complementary input transistor, the gate of the first complementary input transistor being coupled to the gate of the first complementary transistor;

a second complementary transistor having a predetermined size ratio relative to the second complementary input transistor, the gate of the second complementary input transistor being coupled to the gate of the second complementary transistor;

wherein the drains of the first and second complementary transistors are coupled together, and a complementary transconductance current is derived from the drains of the first and second complementary transistors.

9. The apparatus of claim 1, further comprising:

a second voltage to current conversion module configured to convert a second input voltage to a second current;

a second current replication module configured to replicate the second converted current at a 1:N ratio to generate a second transconductance current proportional to the input voltage;

an op amp having positive and negative input terminals and positive and negative output terminals;

a first feedback capacitor coupled in parallel with a first transconductance current to couple the negative output terminal to the positive input terminal, wherein the input voltage corresponds to the voltage across the first feedback capacitor, and wherein the first transconductance current corresponds to the generated transconductance current proportional to the input voltage;

a second feedback capacitor coupled in parallel with the second transconductance current to couple the positive output terminal to the negative input terminal, wherein the second input voltage corresponds to the voltage across the second feedback capacitor; and first and second input capacitors coupling the positive and negative input terminals, respectively, to positive and negative input voltages, respectively.

10. An apparatus comprising:

means for converting an input voltage Vin to an intermediate current using an input transistor having a drain coupled to the input voltage via a resistor; and means for replicating the intermediate current at a 1:N ratio to generate the transconductance current proportional to the input voltage the means for replicating comprising means for coupling the gate voltage of the input transistor to a first transistor to generate a transconductance current proportional to the input voltage minus a reference voltage; and means for generating proportional bias currents for the means for converting and the means for replicating.

11. The apparatus of claim 10, the means for replicating further comprising means for replicating the intermediate current using a class A driving scheme.

12. The apparatus of claim 10, the means for replicating further comprising means for replicating the intermediate current using a class B driving scheme.

13. The apparatus of claim 10, the means for replicating further comprising means for replicating the intermediate current using a class AB driving scheme.

14. A method comprising:

converting an input voltage Vin to an intermediate current, the converting the input voltage comprising:

configuring a gate voltage of an input transistor to generate a drain current, wherein the drain current of the input transistor is proportional to the difference between the input voltage and a common-mode reference voltage; and coupling the input voltage to a drain of the input transistor using a resistor; the method further comprising:

replicating the intermediate current at a 1:N ratio to generate a transconductance current proportional to the input voltage, the replicating the intermediate current comprising:

generating the transconductance current using at least a first transistor having a predetermined size ratio relative to the input transistor, the gate voltage of the input transistor being coupled to the gate voltage of the first transistor;

the method further comprising coupling an input bias current to the drain of the input transistor, wherein the input drain current corresponds to the sum of the input bias current and a signal current proportional to the difference between the input voltage and a common-mode reference voltage.

15. The method of claim 14, the converting the input voltage further comprising:

configuring a gate voltage of an input transistor to generate a drain current, wherein the drain current of the input transistor is a function of the difference between the input voltage and a common-mode reference voltage; and the replicating the intermediate current comprising:

coupling the gate voltage of the input transistor to the gate voltage of a first transistor, the first transistor having a first predetermined size ratio relative to the input transistor;

biasing the first transistor using a first bias current, wherein a first signal current corresponds to the difference between the first bias current and the drain current of the first transistor;

coupling the gate voltage of the input transistor to the gate voltage of a second transistor, the second transistor having a second predetermined size ratio relative to the input transistor;

biasing the second transistor using a second bias current, wherein a second signal current corresponds to the difference between the second bias current and the drain current of the second transistor; and combining a current corresponding to the first signal current with a current corresponding to the second signal current to generate the transconductance current.

16. The method of claim 14, further comprising:

converting a second voltage to a second intermediate current;

replicating the second intermediate current at a 1:N ratio to generate a second transconductance current proportional to the second voltage;

coupling a first transconductance current in parallel with a first capacitor, the first transconductance current and first capacitor coupling a negative output node of an operational amplifier (op amp) to a positive input node of the op amp, the positive input node of the op amp coupled to a first input voltage via a capacitor, wherein the first transconductance current corresponds to the generated transconductance current proportional to the input voltage; and coupling the second transconductance current in parallel with a second capacitor, the second transconductance current and second capacitor coupling a positive output node of the op amp to a negative input node of the op amp, the negative input node of the op amp coupled to a second input voltage via a capacitor.

* * * * *